US006458426B1

(12) United States Patent
Bulovic et al.

(10) Patent No.: US 6,458,426 B1
(45) Date of Patent: Oct. 1, 2002

(54) METHOD FOR DEPOSITING A PATTERNED LAYER OF MATERIAL OVER A SUBSTRATE

(75) Inventors: Vladimir Bulovic, Lexington, MA (US); Stephen R. Forrest, Princeton, NJ (US)

(73) Assignee: The Trustees of Princeton University, Princeton, NJ (US)

(*) Notice: Subject to any disclaimer, the term of this patent is extended or adjusted under 35 U.S.C. 154(b) by 74 days.

(21) Appl. No.: 09/717,351

(22) Filed: Nov. 22, 2000

Related U.S. Application Data

(60) Provisional application No. 60/166,992, filed on Nov. 23, 1999.

(51) Int. Cl.⁷ .................................................. B05D 1/28
(52) U.S. Cl. ....................... 427/458; 427/466; 427/469
(58) Field of Search ................................ 427/457, 458, 427/466, 467, 469, 475, 429; 361/225, 226; 101/492, 494; 118/621, 624, 644, 46, 76, 211, 264–271

(56) References Cited

U.S. PATENT DOCUMENTS 5,512,131 A * 4/1996 Kumar et al.
5,669,973 A * 9/1997 Pletcher et al.

FOREIGN PATENT DOCUMENTS

DE  1461531   * 10/1969
DE  19509908  * 9/1996

OTHER PUBLICATIONS

S.R. Forrest et al., "Large Conductivity Changes in Ion Beam Irradiated Organic Thin Films", *Appl. Phys. Lett.*, 41(8), Oct. 15, 1982, pp. 708–710.

Schmidt et al., "Electron Beam Pattern Generation in Thin–Film Organic Dianhydrides", *Appl. Phys. Lett.*, 40(1), Jan. 1, 1982, pp. 93–95.

* cited by examiner

*Primary Examiner*—Fred J. Parker
(74) *Attorney, Agent, or Firm*—Kenyon & Kenyon

(57) ABSTRACT

This application relates to a method of depositing a patterned layer of material, such as organic material, over a substrate or organizing materials over a substrate. The method involves using a stamp having at least one conductive pathway and an insulating layer to transfer material from a solution to a substrate in a specified pattern. The stamp may be used multiple times to transfer a similar pattern of organic material to multiple substrates or to different portions of the same substrate. The transferred material may then be preferably used as a photolithographic mask for nano-patterning the substrate. This application also relates to a stamp that may be used in depositing a patterned layer of material onto a substrate, a method of forming such a stamp, and a method of depositing a layer of oriented molecules over a substrate.

18 Claims, 6 Drawing Sheets

US 6,458,426 B1

METHOD FOR DEPOSITING A PATTERNED LAYER OF MATERIAL OVER A SUBSTRATE

RELATED APPLICATION

This application claims the benefit of U.S. Provisional Application No. 60/166,992 filed Nov. 23, 1999.

GOVERNMENT RIGHTS

This invention was made with Government support under Contract No. F33615-94-1-1414 awarded by DARPA. The government has certain rights in this invention.

FIELD OF THE INVENTION

The present invention relates to a method of depositing a patterned layer of material over a substrate or organizing material, such as organic molecules, over a substrate. The present invention also relates to a stamp that may be used in depositing a patterned layer of material over a substrate and a method of forming such a stamp.

BACKGROUND OF THE INVENTION

Conventional lithography is limited in resolution by the wavelength of the incident light. Xerography is limited in resolution by the wavelength of light as well. In the art of xerography, patterning is performed by uniformly electrostatically charging a photoconductive layer and discharging the photoconductive layer by exposing it to electromagnetic radiation, such as light. Photoconductor conductivity is changed by the incidence of laser light into a desired pattern.

E-beam lithography is capable of producing higher definition patterning than xerography but has drawbacks in that it is generally a slow process performed serially on wafers and is generally not efficient for large scale applications.

While the above patterning methods are acceptable in certain circumstances, a method of patterning in which nano-scale patterns may be obtained by a process that may be used in large scale applications, is desirable.

SUMMARY OF THE INVENTION

The present invention provides a method of depositing a patterned layer of material over a substrate. In the method of the present invention a stamp is used to transfer material from a solution to a substrate or to organize molecules over a substrate in a specified pattern. In the method, the stamp is immersed in a solution and electrically biased so as to attract molecules to the stamp in a determined pattern. The molecules are then transferred to a substrate. The stamp may be used multiple times to transfer a similar pattern of the material to multiple substrates or to different portions of the same substrate by the stamp. The transferred material may then be preferably used as a photolithographic mask for nano-patterning the substrate.

Also provided are a stamp having a conductive pathway and an insulating layer and a method of forming such a stamp.

BRIEF DESCRIPTION OF THE DRAWINGS

In FIG. 1, the stamp has a conductive pathway comprising a conducting substrate and a patterned conducting layer and there is an insulating layer over the patterned conducting layer of the conductive pathway.

FIG. 2 shows a cross section of the stamp of FIG. 1 immersed in a solution, where the stamp has been biased such that molecules in the solution have been attracted to the insulating layer of the stamp in a pattern.

FIG. 3 shows a cross section of the stamp of FIG. 1 after it has been removed from the solution that it was previously in, where the stamp has material attracted to the insulating layer thereof.

FIG. 4 shows a substrate after it has been contacted by the stamp of FIG. 3, where the material on the stamp of FIG. 3 has been transferred to the substrate.

In FIG. 5 the material on the stamp is arranged such that the molecules are arranged in a similar orientation to one another with respect to their charges. In this embodiment, the molecules are large enough to stretch from above the positively charged portion of the conductive pathway to above the negatively charged portion of the conductive pathway.

DETAILED DESCRIPTION

Figure 1:
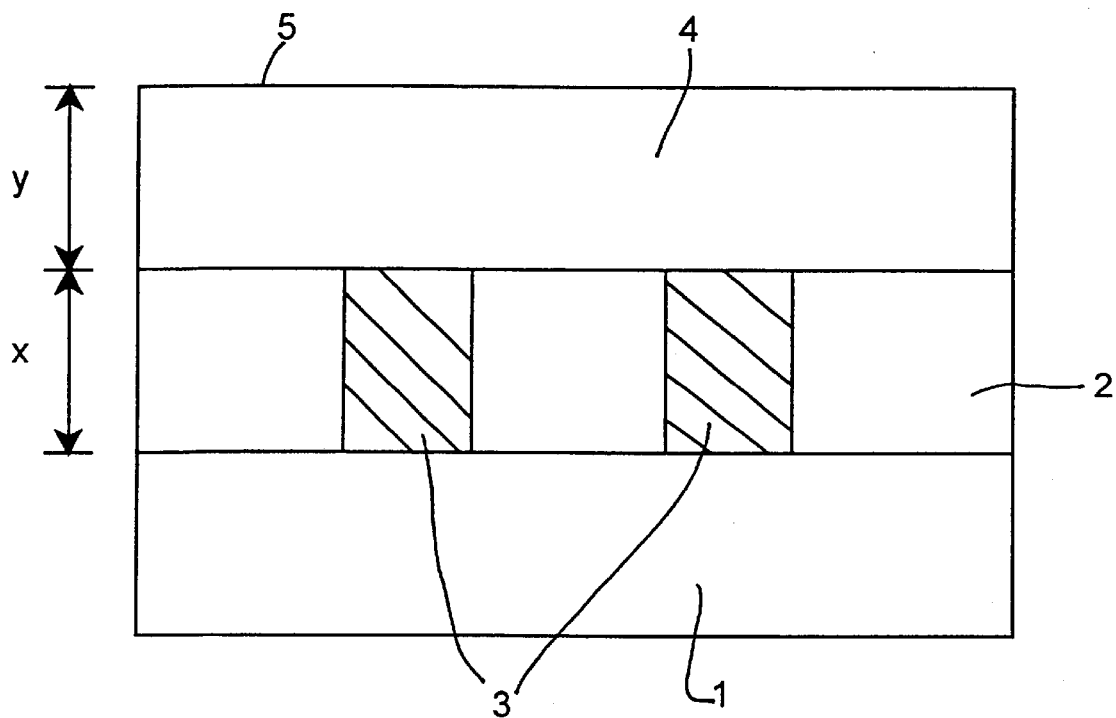
FIG. 1 shows a cross-section of a stamp according to an embodiment of the present invention.

The present invention will be described with reference to the illustrative embodiments in the following processes and drawing figures.

The present invention provides a method of depositing a patterned layer of material or organizing material, such as organic material for example, over a substrate by using a stamp; a stamp; and a method of making the stamp. The stamp of the present invention has at least one conductive pathway and an insulating layer. The stamp may be used to deposit or organize material on a substrate in a pattern by the following method. First, the stamp is immersed for example, in an organic solution having the desired organic molecules therein. The conductive pathway of the stamp is electrically biased such that the desired molecules (in the case of an organic solution, organic molecules) are attracted to the insulating layer of the stamp in a pattern defined by the conductive pathway, which essentially corresponds to the conductive pathway. Alternatively, the pattern in which the desired molecules are attracted to the insulating layer of the stamp is defined by the conductive pathway in that the molecules are stretched between regions of the insulating layer that correspond to the positively and negatively biased regions of the conductive pathway.

Then, according to the present method, the stamp is removed from the solution, and the material remains attracted to the insulating layer of the stamp. The stamp is positioned such that the insulating layer side of the stamp faces a substrate. The stamp is then contacted with the substrate such that the material may be transferred to the substrate. The stamp and/or the substrate may then be treated such that the molecules transfer from the stamp to the substrate as a patterned layer of material. The pattern of the material transferred to the substrate essentially corresponds to the pattern in which the molecules were previously attached to the insulating layer of the stamp.

The transferred material may then be used for one or more of several different purposes including use as a photolithographic mask for patterning the substrate. The above process of depositing a patterned layer of material over a substrate or organizing molecules over a substrate may be repeated multiple times using the same stamp. That is, after the patterned material has been transferred from the stamp to the substrate, the stamp may be re-immersed in a solution, biased such that molecules in the solution are attracted to the insulating layer in a desired pattern, removed from the solution, and contacted with a different substrate or a different portion of the same substrate such that material is transferred to the new substrate or to the new portion of the substrate in a pattern that essentially corresponds to the pattern that was previously transferred to a substrate.

In one embodiment of the present invention the material being patterned is organic material. Methods according to this embodiment include immersing the stamp in an organic solution having organic molecules therein, electrically biasing the conductive pathway of the stamp such that the organic molecules are attracted to the insulating layer of the stamp in a pattern defined by the conductive pathway, removing the stamp from the organic solution, positioning the stamp such that the insulating layer side of the stamp faces a substrate, and contacting the stamp with the substrate such that the organic material may be transferred to the substrate.

In other embodiments of the present invention, the material being patterned is inorganic material.

A. Stamp

The stamp according to the present invention includes at least one conductive pathway and an insulating layer over the conductive pathway. The conductive pathway may be formed in a selected pattern. The selected pattern of the conductive pathway essentially defines the pattern in which the molecules to be eventually patterned over a substrate may be attracted to the insulating layer of the stamp if the stamp is used to deposit a patterned layer of material over a substrate. Depending on several factors, discussed further below, the patterned layer of material may not be exactly the same as the pattern of the conductive pathway(s).

Preferably, the insulating layer is a dielectric insulating layer. Non-limiting examples of suitable insulating layers include aluminum oxide, aluminum nitride, boron carbide, boron nitride, diamond, silicon oxide, silicon carbide, silicon nitride, titanium oxide, titanium carbide, zirconium boride, zirconium carbide, TEFLON® and equivalents or mixtures thereof. Also preferably, the conductivity of the insulating layer is sufficiently low such that organic molecules are selectively attracted to the stamp in a determined pattern as defined by the conductive pathway when the conductive pathway is biased in the method of the present invention described below. If the conductivity of the insulating layer is too high the molecules may be attracted to a greater portion of the surface of the insulating layer than desired or the pattern of molecules may not be as precise as it would be otherwise.

In a preferred embodiment, the conductive pathway(s) of a stamp are defined by a conducting layer over a conducting substrate, where the conducting layer has been patterned by either e-beam or lithography, resulting in exposed areas. In this embodiment, the insulating layer is over the patterned conducting layer. Portions of the conducting layer that have been exposed to e-beam for example, have a higher conductivity than portions of the layer that have not been exposed to e-beam. Thus, the e-beam exposed areas of the layer form a conductive pathway with the conducting substrate.

When the stamp is in a solution having the desired molecules, such as organic molecules, if the conducting substrate is electrically biased such that it is positive, the conductive pathway portions of the stamp attract the negative ends of molecules in the solution to the insulating layer of the stamp in a pattern that essentially corresponds to the pattern of the conductive pathway in the conducting layer. Likewise, when the substrate is negatively biased, the conductive pathway portions of the stamp attract the positive ends of the desired molecules in the solution (e.g., organic molecules) to the insulating layer of the stamp in a similar pattern to that of the conductive pathway.

Alternatively, the conductive pathways may be biased with different polarities such that the molecules in the solution are attracted to the stamp in a similar direction with the positive end of each molecule directed toward one side and the negative end directed toward the other. In particular, when the distance between the positively and negatively biased portions of the conductive pathway is about the same as the size of the molecules being patterned, the molecules are stretched between the portions of the conductive pathway, with the negative end of each molecule being attracted to the positive portion of the conductive pathway and the positive end of the molecule being attracted to the negative portion of the conductive pathway.

Figure 6:
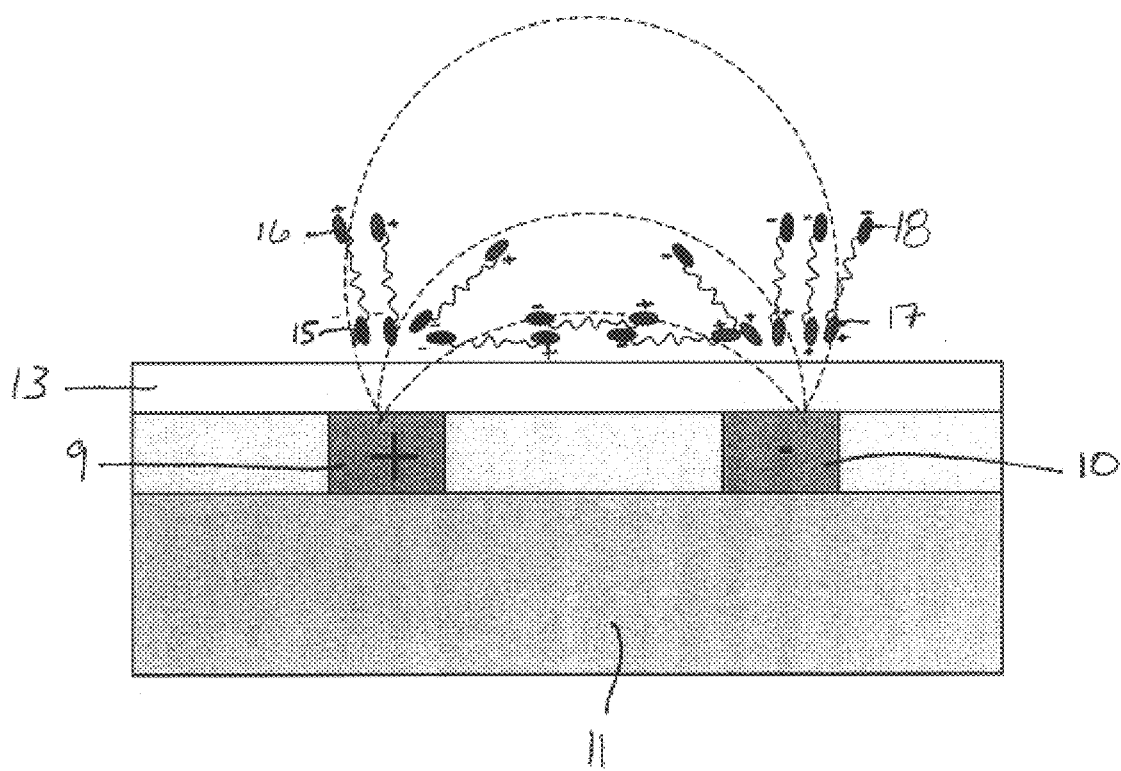
FIG. 6 shows a cross section of a stamp according to another embodiment of the present invention. The stamp in FIG. 6 is identical to that of FIG. 5, except that FIG. 6 depicts a stamp that has been removed from solution where molecules from the solution have been attracted to the stamp, where the molecules are not large enough to stretch from the positively charged portion of the conductive pathway to the negatively charged portion of the conductive pathway.

When the molecules are shorter than the distance between the differently biased portions of the conductive pathway, the negative end of certain molecules will be attracted to the portion of the insulating layer corresponding to the positively charged portion of the conductive pathway, with the negatively charged portion of the conductive pathway exerting certain attractive forces on the positive end of the molecule, such that the positive end of the molecule may be pulled somewhat or entirely in the direction of the negatively charged portion of the conductive pathway. The reverse is also true with the positive end of certain molecules being attracted to the portion of the insulating layer corresponding to the negatively charged portion of the conductive pathway, with the positively charged portion of the pathway exerting certain attractive forces on the negative ends of the molecules. An example of these forces is depicted in FIG. 6 for example.

In yet another embodiment, the molecules may have a negatively charged shell and either no positive charge or the positive charge is in the center of the molecule. In such embodiments the conductive pathway may be positively biased to attract the negatively charged outer shell of the molecules to the insulating layer in a pattern that essentially corresponds to the pattern of the conductive pathway.

In each of these embodiments, the pattern formed by e-beam or lithography is the selected pattern of the conductive pathway that essentially defines the pattern in which molecules may be attracted to the insulating layer of the stamp.

In one embodiment, the layer over a conducting substrate is an organic layer. Illustrative examples of suitable organic materials that may be included in the organic layer are pyridines, carboxylic dianhydrides, and the like.

The use of e-beams to pattern the stamp in certain embodiments of the present invention permanently alters the conductivity of the e-beam exposed portions of the organic layer. The permanent nature of the pattern formed in the stamp by e-beam allows the stamp to be used multiple times to achieve a substantially similar pattern. By way of example, room temperature typical conductivities of an organic layer for example, prior to e-beam exposure, may be on the order of $10^{-10}\Omega^{-1}cm^{-1}$. By way of further example, room temperature conductivities of organic materials after being irradiated by e-beams may be on the order of $10^{4}\Omega^{-1}cm^{-1}$.

As a result of using e-beams to define the pattern of the conductive pathway in certain embodiments of the present invention, the resolution of the pattern of material that may be transferred to a substrate is improved because it is limited by the resolution of the e-beam, rather than by light. Thus, use of e-beams in a stamp of the present invention allows one to obtain high definition patterning. For example, patterns obtained by methods other than by e-beam may have a resolution of typically around 3000 Å, as opposed to the nano-scale patterns (e.g., on the order of 100 Å), which may be obtained by using e-beam patterning as set forth in the preferred embodiments of the present invention. Methods of exposing layers to e-beams are known to those skilled in the art.

FIG. 1 shows a cross-section of a stamp in accordance with a preferred embodiment of the present invention. In FIG. 1 the stamp has a layer 2 over a conducting substrate 1, which together form at least one conductive pathway of a preferred stamp used in accordance with the present invention. As shown in FIG. 1, the layer 2 has been patterned by e-beam for example, in at least one location 3 so as to form a patterned conducting layer. An insulating layer 4 is over the patterned layer 2.

FIG. 1 is now used to describe the thicknesses of layers of the conductive pathway of different embodiments of the present invention (including, but not limited to, the embodiment of FIG. 1). The conductive pathway of the present invention preferably has a layer (such as the layer 2 depicted in FIG. 1, which may be an organic or inorganic layer), in which the conductive pathway is defined. For example in FIG. 1, the conductive pathway may be defined by e-beam irradiation. This layer preferably has a sufficient thickness "x" such that when the conducting substrate is biased, the pathway (for example, e-beam exposed areas 3 of FIG. 1) attracts molecules to the insulating layer in a similar pattern to that of the pathway (e.g., e-beam exposed areas). If the thickness of "x" is too small, the conducting substrate may attract molecules to a greater portion of the surface of the insulating layer than desired. That is, the thickness "x" of the layer must be large enough such that there is a sufficient difference between pull of the conductive pathways (in the embodiment of FIG. 1, the e-beam exposed areas) and the pull of the conducting substrate, when the conductive pathway is biased.

In addition, the thickness of the insulating layer of the stamp (for example, the thickness "y" of the insulating layer 4 of a stamp according to the embodiment depicted in FIG. 1) must be large enough that molecules do not attach to a greater portion of the surface of the insulating layer than desired. Rather, the thickness must be such that the molecules essentially attach to portions of the insulating layer corresponding to the position of the patterned (e.g., e-beam exposed) areas of the conducting layer when the conductive pathway is biased. Additionally, the thickness of the insulating layer of the stamp ("y" in the embodiment shown in FIG. 1) must be small enough such that the patterned (e.g., e-beam exposed) areas actually do attract molecules from the solution to the portions of the insulating layer above the position of the patterned (e.g., e-beam exposed) areas when the conductive pathway is biased. Thicknesses of insulating layers that may be used in accordance with the present invention may be on the order of, for example, 250 Å or 1000 Å.

The thicknesses of portions of the conductive pathway and the insulating layer of the stamp are preferably suitable to attract molecules from the solution to the insulating layer in a pattern that essentially corresponds to the pattern of the conductive pathway, without significantly attracting molecules from the solution to undesired portions of the insulating layer.

In an alternative embodiment of a stamp according to the present invention, silicon and a photoresist may be used to define the conductive pathway of the stamp. Such a conductive pathway may be formed by photolithography methods known to those skilled in the art, which may include for example defining nitrogen and/or phosphorus doped regions in a layer of silicon.

The use of a stamp that does not have e-beam irradiated portions, such as in the above alternative embodiment, may not yield patterns that have as high a resolution as resolutions that may be obtained by using an e-beam to form the stamp. However, the use of such a stamp is advantageous in that such use eliminates the necessity of performing photolithography separately on each and every substrate to be patterned. By using a stamp according to the method of the present invention, patterning need only be performed once on the stamp. Then that pattern may be used multiple times on a single substrate or on multiple substrates to transfer organic molecules to a substrate or to organize molecules over a substrate. Thus, the use of such a stamp is advantageous, even if nano-scale patterns are not obtained.

B. Method of Making a Stamp

A stamp according to the present invention is made by depositing at least one insulating layer over at least one conductive pathway. The conductive pathway and the insulating layer may both be as described above. Preferably, the insulating layer is deposited over the conductive pathway in a thickness that is small enough such that it will allow molecules from a solution to be selectively attracted to portions of the insulating layer when the conductive pathway is biased and is a large enough thickness such that the molecules will not be attracted to a greater portion of the surface of the insulating layer than desired.

Preferably, the conductive pathway is formed by depositing a layer 2 over a conducting substrate 1 and exposing the layer 2 to e-beam. In this embodiment, the e-beam is preferably exposed in a predetermined pattern, which defines the pattern 3 in which molecules from a solution may be attracted to the insulating layer 4 of the stamp when the stamp is used to deposit a patterned layer of material onto a substrate. The conducting substrate and the layer 2 are as defined in the preferred embodiment of the stamp described above.

Alternatively, the conductive pathway may be formed by depositing a layer 2 over a conducting substrate 1 and patterning the layer 2 by conventional lithography. In this embodiment the patterning is also preferably in a predetermined pattern, which defines the pattern 3 in which molecules from a solution may be attracted to the insulating layer 4 of the stamp when the stamp is used to deposit a patterned layer of material onto a Go substrate. The conducting substrate and the layer 2 are as defined in the preferred embodiment of the stamp described above.

In an alternative embodiment of a method of making a stamp according to the present invention, silicon and a photoresist may be used to define the conductive pathway of the stamp. Such a conductive pathway may be formed by photolithography methods known to those skilled in the art, which may include for example defining nitrogen and/or phosphorus doped regions in a layer of silicon.

The layer 2 may be organic or inorganic.

C. Method of Depositing a Patterned Layer of Organic Material Over a Substrate A stamp may be used to deposit material, such as organic material, over a substrate in a pattern or to organize materials over a substrate by the following method. First, a stamp is immersed in a solution having molecules therein (hereinafter "the solution"). In one embodiment, the molecules of the solution each have a positive end and a negative end. Alternatively, molecules can have one charge inside and the other charge on the outside of the molecule, for example, polyelectrolytes. The charge interaction may be either charge induced dipole-dipole interaction or direct dipole-dipole interaction.

In one embodiment, the molecules are organic molecules. In such embodiments, the organic molecules may be polymer chains or molecular organics. In other embodiments the molecules are inorganic.

The stamp used in the present method has at least one conductive pathway and an insulating layer over the conductive pathway. The stamp may be a stamp as set forth above, which may be formed according to the method set forth above. Preferred stamps for use in the present method have a conducting layer over a conducting substrate, and the conductive pathway is formed by the patterning of the conducting layer (for example by exposing the organic layer to e-beam or performing conventional lithography). In a preferred stamp according to the present invention, at least one insulating layer is deposited over the patterned conducting layer.

After the stamp is immersed in a solution, the conductive pathway of the stamp is electrically biased such that the conductive pathway is biased with respect to the solution. The biasing causes positive or negative ends of molecules in the solution, depending on whether the conductive pathway is negatively or positively biased, respectively, to be attracted to portions of the insulating layer corresponding to the pattern of the conductive pathway by electrostatic attraction. That is, electrostatic forces act between the charged objects and are proportional to their electrostatic charges. Thus, the end of the molecules that is charged oppositely to the charge of the conductive pathway is attracted to the stamp. Alternatively, if the molecule is negatively charged on the surface of the molecule, the entire molecule will be attracted to the portion of the insulating layer corresponding to a positively biased conductive pathway, rather than one end of the molecule being attracted.

The molecules in the solution are attracted to the insulating layer of the stamp in a pattern essentially defined by the conductive pathway because the biased conductive pathway attracts molecules from the solution through the insulating layer to portions of the insulating layer that are nearest to the conductive pathway.

Figure 2:
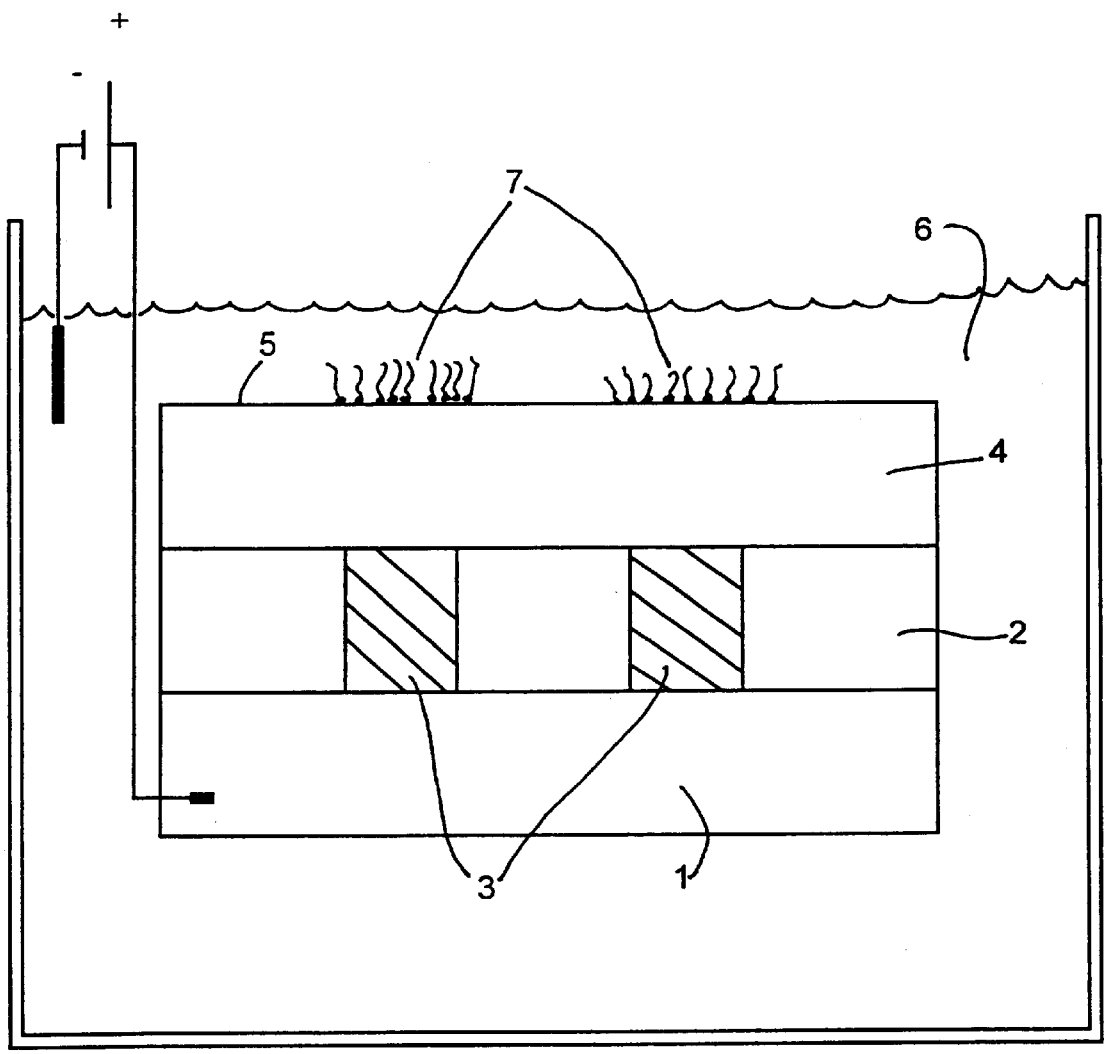
FIG. 2 shows a step in the method of depositing a patterned layer of a conducting material onto a substrate.

FIG. 2 shows a cross section of a stamp immersed in an solution 6 in accordance with a preferred embodiment of the method of the present invention. In FIG. 2, the conducting substrate of the stamp 1 has been biased such that it is positive with respect to the solution. The figure shows how the negative ends of the molecules 7 in the solution are electrostatically attracted to the insulating layer 4 of the stamp in a pattern, which substantially corresponds to the pattern of the e-beam exposed areas 3 of the conductive layer 2.

As can be seen in FIG. 2, material attracted to the insulating layer of a stamp may be attracted to areas of the insulating layer that are somewhat outside (i.e., not directly above) the areas of the conductive pathway. Electrostatic attraction from the charged conductive pathway occurs through the insulating layer. Material from the solution may be attracted to areas of the insulating layer, which are larger in area than the area of the conductive pathway. Whether material from the solution is attracted to the insulating layer outside the area directly above the conductive pathway depends on various factors including for example, the strength of the bias, and the thickness of the insulating layer. It is desirable, to control these factors, so as to minimize the amount of material attracted to areas of the insulating layer that are not directly above areas of the conductive pathway.

According to certain methods of the present invention, after molecules from the solution are attracted to the insulating layer of the stamp, the stamp is then removed from the solution with the molecules still attracted to the insulating layer of the stamp. The stamp is then positioned over a substrate onto which the molecules are to be transferred such that the insulating layer of the stamp faces the substrate.

Figure 3:
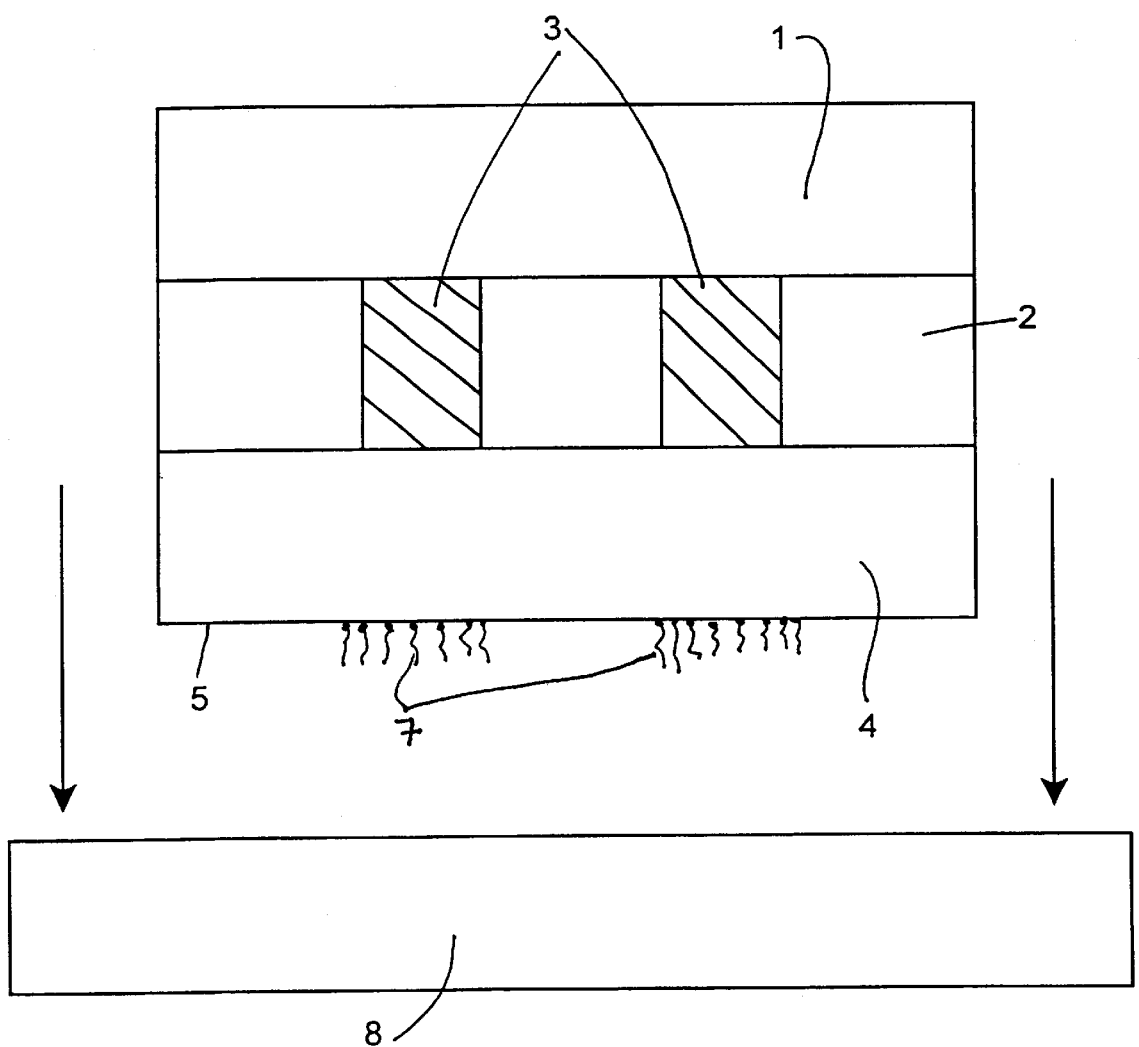
FIG. 3 shows another step in the method of depositing a patterned layer of conducting material onto a substrate.

An example of this positioning is demonstrated in FIG. 3. FIG. 3 shows a cross section of a preferred stamp according to the present invention, after it has been removed from the solution and positioned over a substrate. As shown in FIG. 3, the stamp has material 7 that remains attracted to the insulating layer 4 of the stamp, even after the stamp has been removed from the solution 6. The stamp depicted in FIG. 3 is positioned in accordance with the present invention such that the side of the stamp having the insulating layer 4 faces the substrate 8 onto which the material is to be deposited.

The insulating side of the stamp is subsequently contacted with a substrate such that the material may be transferred to the substrate in a similar pattern to the pattern in which the molecules from the solution were attached to the insulating layer of the stamp.

The stamp and/or the substrate may be treated to assist in or expedite the transfer of material to the substrate. In a preferred treatment method, if the conducting substrate of the stamp was positively biased in the organic solution, the material is transferred from the stamp to the substrate by applying a negative bias to the stamp. Alternatively, in another preferred treatment method, if the conducting substrate of the stamp was negatively biased in the solution, the material is transferred from the stamp to the substrate by applying a positive bias to the stamp. By reversing the bias that initially attracted the molecules to the insulating layer, the molecules are no longer attracted to the insulating layer and transfer to the substrate.

In another embodiment, the treatment may include transferring the material to the substrate by applying heat to the substrate. Such heat treatment may fuse the material to the substrate. In yet another preferred embodiment, the treatment may include transferring material to the substrate by optically irradiating the stamp and/or the substrate. Such a treatment may act to promote adhesion of molecules to the substrate.

Also encompassed by the present invention, is the use of combinations of any of the treatments described herein with one another or in conjunction with any other treatment.

Figure 4:
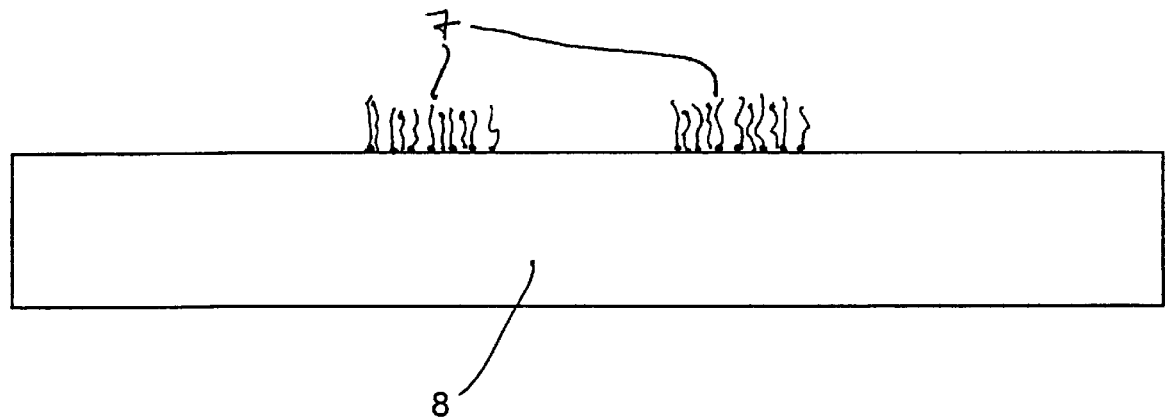
FIG. 4 shows a further step in the method of depositing a patterned layer of conducting material onto a substrate.

FIG. 4 depicts substrate 8 after it has been contacted by a stamp in accordance with the present invention, such as the preferred stamp depicted in FIG. 3. As shown in FIG. 4, the material that was previously attracted to the insulating layer of the stamp has been transferred to the substrate.

Figure 5:
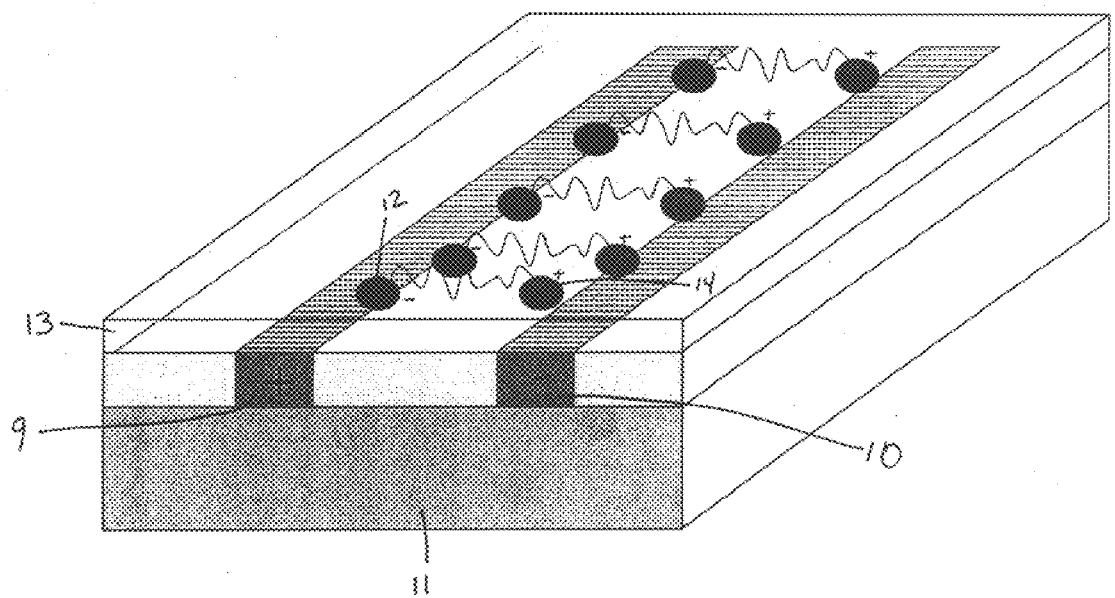
FIG. 5 shows a three-dimensional view of a stamp according to another embodiment of the present invention, after it has been removed from a solution in which molecules from the solution were attracted to the stamp due to the electrostatic charges of the stamp.

FIG. 5 depicts an example of a stamp according to another embodiment of the present invention. The stamp depicted in FIG. 5 has previously been immersed in a solution and molecules from the solution have been attracted to the insulating layer of the stamp (similarly to the embodiment described above and shown in FIG. 2), and subsequently the stamp has been removed from the solution. In the embodiment shown in FIG. 5 however, the two depicted portions of the conductive pathway (9 and 10) over the conducting substrate 11, are biased with different charges than one another (positively and negatively). The embodiment in FIG. 5 depicts a situation in which the molecules that have been attracted to the stamp are approximately the same size (i.e., with respect to the length between positive and negative ends of the molecules) as the distance between the positively and negatively charged portions of the conductive pathway. Accordingly, the negative end 12 of the molecules is attracted to the portion of the stamp's insulating layer 13 that essentially corresponds to the positively charged portion of the conductive pathway, while the positive end 14 of the molecules is attracted to the portion of the stamp's insulating layer 13 that essentially corresponds to the negatively charged portion of the conductive pathway. This results in a stretched array, where the molecules are essentially stretched parallel to the stamp and the charged ends of the molecules are oriented in substantially the same direction as one another in the planar field.

The molecules attracted to the stamp shown in FIG. 5 may subsequently be transferred to a substrate as described above. That is, the insulating side of the stamp is contacted with a substrate such that the material (molecules) on the stamp may be transferred to the substrate in a similar pattern to the pattern in which the molecules from the solution were attracted to the insulating layer of the stamp. Additionally, the stamp and/or substrate may be treated (as described above or as known in the art) to assist in or expedite the transfer of material to the substrate. FIG. 6 also shows a stamp according to an embodiment of the present invention that has previously been immersed in a solution, had molecules attracted to the insulating layer of the stamp due to electrostatic charges, and been removed from the solution. Similarly to FIG. 5, in the stamp shown in FIG. 6, the two depicted portions of the conductive pathway (9 and 10) over the conducting substrate 11, are biased with different charges than one another (positively and negatively). The embodiment in FIG. 6 depicts a situation in which the molecules that have been attracted to the stamp are shorter (i.e., with respect to the length between positive and negative ends of the molecules) than the distance between the positively and negatively charged portions of the conductive pathway. Therefore, the molecules are not large enough to stretch from the positively charged portion of the conductive pathway to the negatively charged portion of the conductive pathway. In this embodiment, the negative end 15 of certain molecules will be attracted to the portion of the insulating layer corresponding to the positively charged portion of the conductive pathway 9, with the negatively charged portion of the conductive pathway 10 exerting certain attractive forces on the positive end 16 of those molecules, such that the positive end 16 of those molecules is pulled somewhat or entirely in the direction of the negatively charged portion 10 of the conductive pathway. The reverse is also true with the positive end 17 of certain molecules being attracted to the portion of the insulating layer corresponding to the negatively charged portion 10 of the conductive pathway, with the positively charged portion 9 of the pathway exerting certain attractive forces on the negative ends 18 of the molecules.

In this embodiment (as shown in FIG. 6) the molecules are not all parallel to the stamp while they are on the stamp. However, when the molecules are transferred to a substrate as described above with regard to other embodiments of the present invention, the transferred molecules (material) is substantially parallel to the substrate and the negative ends of the molecules and the positive ends of the molecules are all facing in the same planar direction as one another. Thus, the molecules are patterned such that their dipoles are oriented in the same direction.

A substrate having a patterned layer of material or organized materials deposited thereon in accordance with the methods of the present invention may be used for a variety of purposes. In a preferred embodiment, the patterned layer of material transferred to a substrate may be used to create a photolithographic mask for nano-patterning the substrate.

Substrates having a patterned layer of material or organized materials deposited thereon in accordance with the method of the present invention may also be used in forming stretched arrays in which the molecules that are patterned are all ordered in the same direction.

Non-limiting examples of how the present invention may be used include assembling organized molecules to make molecular electronics and forming diodes, transistors, optically active transistors, and polarization sensitive detectors.

While the present invention is described with respect to particular examples and preferred embodiments, it is understood that the present invention is not limited to these examples and embodiments. In particular, the present invention is not limited to the formation of photolithographic masks and may be applied to a wide variety of devices. In addition, the present invention is not limited to the particular examples and embodiments described. The present invention as claimed therefore includes variations from the particular examples and preferred embodiments described herein, as will be apparent to one of skill in the art.

What is claimed is:

1. A method of depositing a patterned layer of material onto a substrate comprising:

(a) immersing a stamp in a solution, wherein the stamp has at least one conductive pathway and at least one insulating layer over the conductive pathway, and wherein the solution comprises molecules each having at least one charged portion;

(b) biasing the conductive pathway of the stamp such that the conductive pathway is charged with respect to said solution, and such that portions of the molecules having an opposite charge of the conductive pathway are attracted to the insulating layer by electrostatic attraction in a pattern essentially defined by the pattern of the conductive pathway;

(c) removing the stamp from the solution;

(d) positioning the stamp over a substrate; and (e) transferring the molecules from the stamp to the substrate.

2. The method of claim 1, wherein the stamp comprises a conducting layer over a conducting substrate, wherein the conducting layer has been exposed to e-beam to form at least one conductive pathway; and an insulating layer over the conducting layer.

3. The method of claim 1, wherein the stamp comprises a conducting layer over a conducting substrate, wherein the conducting layer has been patterned by lithography; and an insulating layer over the conducting layer.

4. The method of claim 1, wherein the insulating layer of the stamp comprises a dielectric insulating layer.

5. The method of claim 1, wherein the conductive pathway is charged positively with respect to the solution, the molecules have positively charged ends and negatively charged ends, and the negative ends of the molecules are attracted to the insulating layer by electrostatic attraction.

6. The method of claim 1, wherein the conductive pathway is charged positively with respect to the solution, and negatively charged molecules are attracted to the insulating layer by electrostatic attraction.

7. The method of claim 1, wherein the conductive pathway is charged negatively with respect to the solution, the molecules have positively charged ends and negatively charged ends, and positive ends of the molecules are attracted to the insulating layer by electrostatic attraction.

8. The method of claim 5, wherein transferring the molecules from the stamp to the substrate comprises contacting the insulating layer of the stamp with the substrate;

applying a negative bias to the stamp; and removing the stamp from contact with the substrate.

9. The method of claim 7, wherein transferring the molecules from the stamp to the substrate comprises contacting the insulating layer of the stamp with the substrate;

applying a positive bias to the stamp; and removing the stamp from contact with the substrate.

10. The method of claim 1, wherein transferring the molecules from the stamp to the substrate comprises contacting the insulating layer of the stamp with the substrate;

applying heat to the substrate; and removing the stamp from contact with the substrate.

11. The method of claim 1, wherein transferring the molecules from the stamp to the substrate comprises contacting the insulating layer of the stamp with the substrate;

optically irradiating the stamp and the substrate; and removing the stamp from contact with the substrate.

12. The method of claim 1, wherein the solution is an organic solution and wherein the molecules are organic molecules.

13. The method of claim 11, wherein the organic solution is a polymer solution and the organic molecules are polymer chains.

14. The method of claim 1, wherein portions of the conductive pathway are charged oppositely to one another, a portion being positively charged and a portion being negatively charged; and negative ends of the molecules are attracted to positively charged portions of the conductive pathway and positive ends of the molecules are attracted to negatively charged portions of the conductive pathway, forming a stretched array of molecules oriented similarly with respect to one another.

15. A method for organizing molecules over a substrate comprising:

(a) immersing a stamp in a solution, wherein the stamp has at least one conductive pathway having a particular pattern and at least one insulating layer over the conductive pathway, and wherein the solution comprises molecules each having at least one charged portion;

(b) biasing the conductive pathway of the stamp such that the conductive pathway is charged with respect to said solution, and such that portions of the molecules having an opposite charge of the conductive pathway are attracted to the insulating layer by electrostatic attraction in a pattern essentially defined by the pattern of the conductive pathway;

(c) removing the stamp from the solution;

(d) positioning the stamp over a substrate; and (e) transferring the molecules from the stamp to the substrate.

16. The method of claim 15, wherein the pattern in which the molecules are attracted to the insulating layer of the stamp essentially corresponds to the pattern of the conductive pathway.

17. The method of claim 15, wherein the pattern in which the molecules are attracted to the insulating layer of the stamp, is a stretched array of molecules having positive ends and negative ends, wherein the positive ends and negative ends are each attracted to portions of the insulating layer corresponding to negatively and positively charged portions of the conductive pathway, respectively, such that the molecules are essentially parallel to the stamp.

18. The method of claim 15, wherein the molecules that are transferred from the stamp to the substrate are organized in essentially the same planar direction as one another with respect to their dipoles.

* * * * *

UNITED STATES PATENT AND TRADEMARK OFFICE
CERTIFICATE OF CORRECTION

PATENT NO.    : 6,458,426 B1
DATED         : October 1, 2002
INVENTOR(S)   : Bulovic et al.

It is certified that error appears in the above-identified patent and that said Letters Patent is hereby corrected as shown below:

Column 5,
Lines 11-12, change "$10^4 \Omega^-_1 cm^{-1}$" to -- $10^4 \Omega^{-1} cm^{-1}$ --; and Column 7,
Line 1, delete "Go".

Signed and Sealed this

Third Day of June, 2003

JAMES E. ROGAN
*Director of the United States Patent and Trademark Office*